United States Patent [19]

Sasaki

[11] 4,423,431

[45] Dec. 27, 1983

[54] SEMICONDUCTOR INTEGRATED CIRCUIT DEVICE PROVIDING A PROTECTION CIRCUIT

[75] Inventor: Nobuo Sasaki, Kawasaki, Japan

[73] Assignee: Fujitsu Limited, Kawasaki, Japan

[21] Appl. No.: 219,893

[22] Filed: Dec. 24, 1980

[30] Foreign Application Priority Data

Dec. 24, 1979 [JP] Japan ................................ 54/167825

[51] Int. Cl.³ ...................... H01L 27/02; H01L 29/78; H01L 29/04
[52] U.S. Cl. ........................................ 357/41; 357/23; 357/59; 307/304; 361/56
[58] Field of Search ................... 357/41, 23 TF, 23 C, 357/59, 23 GP, 23 MG; 307/304, 303; 361/56

[56] References Cited

U.S. PATENT DOCUMENTS 3,777,216 12/1973 Armstrong ........................ 357/41 X
4,288,829 9/1981 Tango ......................... 357/23 TF X

FOREIGN PATENT DOCUMENTS 54-159188 12/1979 Japan ...................................... 357/41
54-167825 12/1979 Japan .

OTHER PUBLICATIONS

M. Lenzlinger, "Gate protection of MIS devices", IEEE Transactions of Electron Devices, vol. ED-18, No. 4 (1971), pp. 249-257.
G. Briggs, S. J. Connor, J. O. Sinniger and R. G. Stewart, "40-MHz CMOS-on-Sapphire Microprocessor", IEEE Transactions on Electron Devices, vol. ED-25, No. 8, (1978), pp. 952-959.

Primary Examiner—Andrew J. James
Assistant Examiner—J. Carroll
Attorney, Agent, or Firm—Daniel Jay Tick

[57] ABSTRACT

A protective semiconductor integrated circuit device for protecting an internal circuit against an excessively high voltage has a first resistor of a low value resistance interposed between an input terminal and an input gate of the internal circuit. One of the drain and source regions of an MIS type transistor is connected to the input gate of the internal circuit to be protected and the other region of the source and drain is grounded. A capacitor is interposed between the gate of the MIS transistor and the input terminal. A second resistor or a diode of reverse polarity is interposed between the gate of the MIS transistor and ground. The protective device may be fabricated using, a bulk silicon, an insulating substrate such as sapphire, spinel or semi-insulating material, simultaneously with the internal circuit and without changing processes for fabrication of the internal circuit and without requiring any additional masking steps.

5 Claims, 8 Drawing Figures

SEMICONDUCTOR INTEGRATED CIRCUIT DEVICE PROVIDING A PROTECTION CIRCUIT

BACKGROUND OF THE INVENTION

The present invention relates to a semiconductor integrated circuit (IC) device. More particularly, the invention relates to protective circuits for protecting an insulated gate type transistor at an input in the internal circuit of a semiconductor IC against a high voltage accidently applied to the input terminal and to such a protective circuit having a silicon-on-sapphire (SOS) structure in which desired circuit elements are fabricated in a silicon island on an insulating substrate.

A protective circuit is generally provided in fabricating a metal-oxide-semiconductor (MOS) IC utilizing a silicon substrate in order to prevent an excessively high voltage from being applied accidently from an input terminal to an input gate of an MOS transistor of an internal circuit. The protective circuits are provided because the insulation layer such as, for example, the silicon dioxide layer in series with the gate, is very thin, so that if too large a voltage is applied from the input terminal, as experienced with electrostatic discharge from handling on a dry day, the oxide layer ruptures due to excessive electrostatic field stress. In order to prevent this, the protective circuit includes a resistor of a resistance value in the order of 1 kΩ connected in series and a protective transistor connected between the gate of the protected internal transistor and ground. The protective transistor is also fabricated with one MOS transistor, but a field oxide layer of approximately 7000 Å thick is used as the insulating layer and its gate is fabricated with an aluminum layer even for the silicon gate MOS IC's. Thus, the threshold voltage of the protective transistor is approximately ten times larger than that of the internal transistor, of which the threshold voltage is usually about 0.8 V. Under normal operating conditions, the protective transistor is OFF, but when an abnormal voltage is applied to the input terminal, it turns ON causing a voltage drop at the resistor and permitting charges to be passed to ground. This maintains the voltage at the gate of the internal transistor at a low value and protects said transistor. In other words, the input voltage at the input terminal is not applied directly to the internal transistor by virtue of the resistor, but is applied to the protective transistor first.

It has also been proposed to replace the protective transistor with a diode. For convenience, N-channel type MOS IC's are considered here. When a negative voltage is applied, the diode permits current to flow to ground. When a positive voltage, which is higher8c than the higher voltage of the MOS device, is applied, current is also permitted to flow to ground. However, the performance of the diode is not as effective as that of the protective transistor.

In a SOS IC, a silicon semiconductor layer is grown on an insulating sapphire substrate and the field oxide layer surrounding an active region of the silicon semiconductor layer is etched away, or partially removed by etching, and oxidized to form an insulating layer of silicon dioxide to confine the active region to a silicon island. A gate insulating layer and a gate electrode of polycrystalline silicon are fabricated centrally on the silicon island. Utilizing the gate electrode as a mask, source and drain regions are formed by diffusion of impurities or by ion-implantation of impurities, and an MOS transistor is formed. There is practically no problem in using this MOS transistor as the internal transistor. However, it is not suitable to use the MOS transistor as the protective transistor, because the gate insulating layer is thin and has a low voltage withstanding ability, so that said layer itself is likely to be ruptured. It is thus desired, as is the case with a bulk MOS IC, to utilize a thick field oxide layer surrounding the silicon island in order to form a transistor similar to the protective transistor. However, in the SOS structure, there is an insulating substrate, and not a silicon semiconductor, immediately below the field oxide layer, so that such a transistor cannot be fabricated.

Another circuit is in use as a protective circuit in an SOS MOS IC, because the field oxide layer cannot be used for the gate oxide layer of the protective transistor and it is difficult to make a thick gate oxide layer in addition to the thin gate oxide layer in the internal circuits. Such circuit contains, in addition to the series resistor, two silicon gate MOS transistors, both P-channel type. A first of the two transistors is connected between the gate of the protected transistor and the positive power source, and the second of the two transistors is connected between the gate and ground. The gate is connected through the resistor to the input terminal. The gate of the first transistor is connected to the power source, and the gate of the second transistor is connected to the gate of the protected transistor. Therefore, under normal conditions, that is, when the voltage at the input terminal is equal to the level between the power source and ground, the first and second transistors are both OFF. When the voltage Vi at the input terminal has a value as $$Vi >> Vcc > 0 \text{ or } Vi << 0,$$

or more particularly, when Vi exceeds the value $$Vcc + |Vth3|$$

where Vth3 is the threshold voltage of the first transistor, said transistor turns ON to pass current from the input terminal to the power source. When the voltage of input terminal falls below $-|Vth4|$, where Vth4 is the threshold voltage of the second transistor, said second transistor turns ON and causes a current flow between the input terminal and ground. The first and second transistors may be N-channel type, in which case the gate of the first transistor is connected to the gate of the protected transistor, and the gate of the second transistor is connected to ground. The gate of the protected transistor of the internal circuit is thus protected. However, the gate insulating layer of either the first or second transistor is as thin as that of the protected transistor, so that when an excessively high voltage is applied to the input terminal, the insulator between the drain and the gate of either the first or second transistor is very likely to be ruptured.

The principal object of the invention is to provide a protective circuit for protecting an insulated gate transistor at an input in the internal circuit of semiconductor integrated circuits against a high voltage.

An object of the invention is to solve problems experienced with an SOS structure, the field oxide of which cannot be utilized.

Another object of the invention is to fabricate a protective transistor without complicating the processes for the manufacture of such protective transistor.

BRIEF SUMMARY OF THE INVENTION

In order to achieve the objects of the invention and in accordance with the invention, a semiconductor integrated circuit device comprises a first resistor interposed between an input terminal and an input gate of an element to be protected. One of the drain and source regions of an MIS type transistor is connected to the input gate of the element to be protected and the other region of the source and drain is connected to ground. A capacitor is interposed between the gate of the MIS type transistor and the input gate. A second resistor, or a diode, is connected between the gate of MIS transistor and ground.

In accordance with the invention, a semiconductor integrated circuit device is formed with the elements of an SOS structure comprising an internal circuit and a protective circuit to protect an insulated gate type transistor at an input in the internal circuit. A transistor of the protective circuit is formed like the insulated gate transistor in the internal circuit to be protected. The gate of such transistor is grounded through a resistor or a diode of reverse polarity. A metal electrode is provided on the gate through an insulation layer. An input signal is applied to the metal electrode. One of the source and drain regions of the transistor is grounded. An input signal is simultaneously applied to the other region of the source and drain, and to the input gate of the insulated gate transistor in the internal circuit.

BRIEF DESCRIPTION OF THE DRAWINGS

In order that the invention may be readily carried into effect, it will now be described with reference to the accompanying drawings, wherein.

DETAILED DESCRIPTION OF PREFERRED EMBODIMENTS

Figure 1:
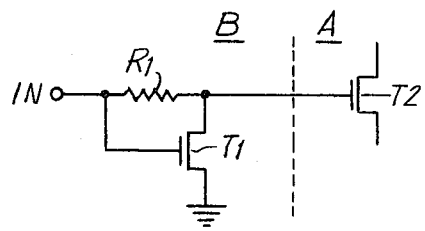
FIG. 1 is a circuit diagram of a prior art protective circuit of an MOS IC utilizing a silicon substrate.

A prior art protective circuit B which is generally provided in fabricating a metal-oxide-semiconductor (MOS) IC utilizing a silicon substrate is shown in FIG. 1. The circuit B prevents an excessively high voltage from being applied accidently from an input terminal IN to an input gate of an MOS transistor T2 of an internal circuit A. The protective circuits are provided because the insulation layer such as, for example, the silicon dioxide layer in series with the gate, is very thin, so that if too large a voltage is applied from the input terminal IN as experienced with electrostatic discharge from handling on a dry day, the oxide layer ruptures due to excessive electrostatic field stress. In order to prevent this, the protective circuit B includes a resistor R1 of a resistance value in the order of 1 kΩ connected in series and a protective transistor T1 connected between the gate of the protected internal transistor T2 and ground. The transistor T1 is also fabricated with one MOS transistor, but a field oxide layer of approximately 7000 Å thick is used as the insulating layer and its gate is fabricated with an aluminum layer even for the silicon gate MOS IC's. Thus, the threshold voltage of the protective transistor T1 is approximately ten times larger than that of the internal transistor T2, of which the threshold voltage is usually about 0.8 V. Under normal operating conditions, the transistor T1 is OFF, but when an abnormal voltage is applied to the input terminal IN, it turns ON, causing a voltage drop at the resistor R1 and permitting charges to be passed to ground. This maintains the voltage at the gate of the transistor T2 at a low value and protects said transistor. In other words, the input voltage at the input terminal IN is not applied directly to the transistor T2 by virtue of the resistor R1, but is applied to the transistor T1 first.

It has also been proposed to replace the transistor T1 of FIG. 1 with a diode. For convenience, N-channel type MOS IC's are considered here. When a negative voltage is applied, the diode permits current to flow to ground. When a positive voltage, which is higher than the breakdown voltage of the MOS device, is applied, current is also permitted to flow to ground. However, the performance of the diode is not as effective as that of the transistor T1 of FIG. 1.

Figure 2:
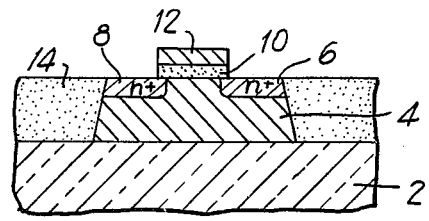
FIG. 2 is a cross-sectional view of an MOS transistor of SOS structure.

In a known SOS IC, as shown in FIG. 2, a silicon semiconductor layer is grown on an insulating sapphire substrate 2, and the field oxide layer surrounding an active region of the silicon semiconductor layer is etched away, or partially removed by etching, and oxidized to form an insulating layer 14 of silicon dioxide to confine the active region to an silicon island 4. A gate insulating layer 10 and a gate electrode 12 of polycrystalline silicon are fabricated centrally on the silicon island 4. Utilizing the gate electrode 12 as a mask, source and drain region 6 and 8 are formed by diffusion of impurities or by ion-implantation of impurities, and an MOS transistor is formed. There is practically no problem in using this MOS transistor as the transistor T2 of the internal circuit A of FIG. 1. However, it is not suitable to use the MOS transistor as the transistor T1 of the protective circuit B, because the gate insulating layer 10 is thin and has a low voltage withstanding ability, so that said layer itself is likely to be ruptured. It is thus desired, as is the case with a bulk MOS IC, to utilize a thick field oxide layer 14 surrounding the silicon island 4 in order to form a transistor similar to the transistor T1 of FIG. 1. However, in the SOS structure, there is an insulating substrate 2, and not a silicon semiconductor, immediately below the field oxide layer 14, so that such a transistor cannot be fabricated.

Figure 3:
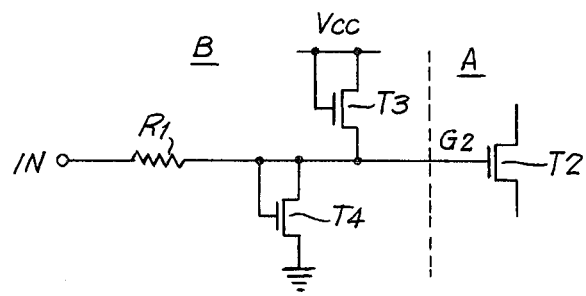
FIG. 3 is a circuit diagram of a prior art protective circuit in an SOS IC.

Another known circuit B, shown in FIG. 3, is in use as a protective circuit in an SOS MOS IC, because the field oxide layer 14 cannot be used for the gate oxide layer of the transistor T1 of FIG. 1, and it is difficult to make a thick gate oxide layer in addition to the thin gate oxide layer in the internal circuits. Such circuit contains, in addition to the series resistor R1, two silicon gate MOS transistors T3 and T4, both P-channel type. A transistor T3 is connected between the gate G2 of the transistor T2 and the positive power source Vcc, and the transistor T4 is connected between said gate and ground. The gate G2 is connected through the resistor R1 to the input terminal IN. The gate of the transistor T3 is connected to the power source Vcc, and the gate of transistor T4 is connected to the gate G2. Therefore, under normal conditions, that is, when the voltage Vi at the input terminal IN is equal to the level between the power source Vcc and ground, both transistors T3 and T4 are OFF. When the voltage Vi has a value as $$Vi >> Vcc > 0 \text{ or } Vi << 0,$$

or, more particularly, when Vi exceeds the value $$Vcc + |Vth3|$$

where Vth3 is the threshold voltage of the first transistor T3, said transistor T3 turns ON to pass current from the input terminal IN to the power source Vcc. When the voltage of input terminal IN falls below $-|Vth4|$, where Vth4 is the threshold voltage of the transistor T4, said transistor turns ON and causes a current flow between the input terminal IN and ground. The transistors T3 and T4 may be N-channel type, in which case the gate of the transistor T3 is connected to the gate G2, and the gate of the transistor T4 is connected to ground. The gate of the transistor T2 of the internal circuit A is thus protected. However, the gate insulating layer of either transistor T3 or T4 is as thin as that of the transistor T2, so that when an excessively high voltage is applied to the input terminal IN, the insulator between the drain and the gate of either transistor T3 or T4 is very likely to be ruptured.

Figure 4A:
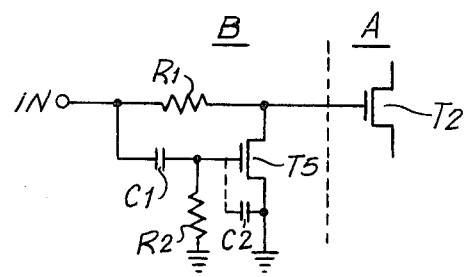
FIGS. 4A, 4B and 4C are an equivalent circuit diagram, a cross-sectional view and a plan view, respectively, of an embodiment of the semiconductor integrated circuit device of the invention.
Figure 4B:
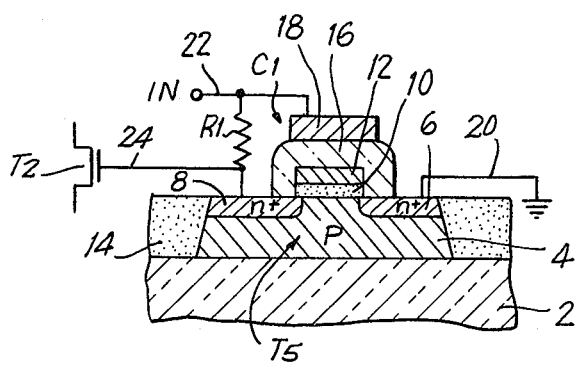
Figure 4C:
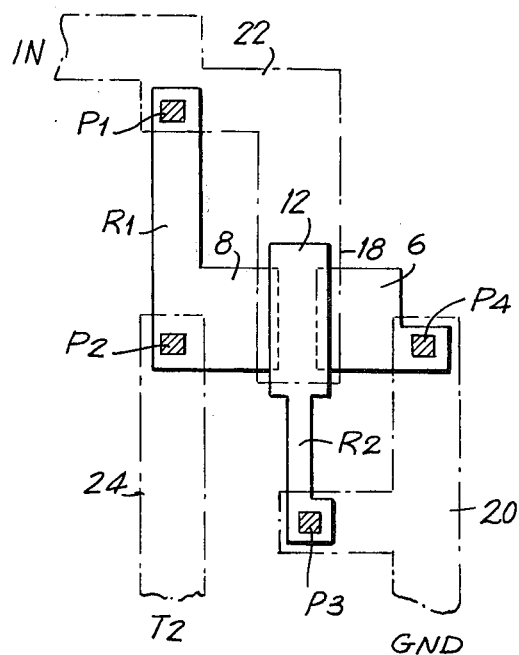

FIGS. 4A, 4B and 4C are an equivalent circuit diagram, a cross-sectional view and a plan view, respectively, of an embodiment of the semiconductor integrated circuit device of the invention. A transistor T5 of FIG. 4A is an enhancement mode silicon gate MOS transistor, fabricated by the same process as that by which the transistor T2 in the internal circuit A is formed, and its insulating layer is not particularly prepared thick. The gate of the transistor T5, grounded via a resistor R2, having a resistance value about 1 MΩ, is connected to an input terminal IN through a capacitor C1. This structure provides the transistor T5 with the same function as that of the transistor T1 of FIG. 1.

More particularly, the transistor T5 is provided with a thin insulating oxide layer, like the transistor T2. However, by virtue of the capacitor C1, an input signal is not directly applied to the gate of the transistor T5. When the withstanding voltage of the capacitor C1 is positively high, an excessively high voltage is not directly applied to the oxide layer of the gate of the transistor T5. That is, the transistor T5 is turned ON without rupturing its gate, and causes current to flow to ground.

In FIG. 4A, the resistor R2 performs as important role. There is a gate of the transistor T5 in a region between said transistor T5 and the capacitor C1. If the resistor R2 were not provided, the gate region floats. It is not possible to predict what potential the floating region will have, and if charges are injected thereinto from other places, there is a charge up in the floating region. This means that the transistor T5 may unexpectedly turn ON, and an input signal may not be transmitted to the transistor T2. To prevent this, the resistor R2, having a high value of resistance, is provided. For a high voltage noise such as electrostatic discharge, the transistor T5 thus turns ON and causes an electric charge to be passed to ground, because the duration of the high voltage noise is short, so that the resistor R2 may be approximated not to be present.

Otherwise, that is, under normal operating conditions, the gate of the transistor T5 is kept grounded by the resistor R2. A normal signal input of 5 V, for example, passes through the capacitor C1 to the transistor T5. However, since there is a voltage drop at the capacitor C1, the signal cannot turn the transistor T5 ON. Thus, the transistor T5 remains OFF when normal input signals are applied, so that said signals are permitted to pass to the transistor T2 alone. In short, if an excessively high voltage is applied to the input gate IN, the transistor T5 is turned ON to cause an electric charge to be passed to ground. If a negative high voltage is applied to the terminal IN shown in FIGS. 4A and 4B, the transistor T5 also turns ON and a negative charge is swept away through said transistor, thereby protecting the transistor T2. The voltage of the heavily doped region 8 shown in FIG. 4B is lower than that of the heavily doped region 6, and the region 8 becomes source, and the gate to source voltage becomes high enough to turn the transistor T5 ON because of the voltage drop at the capacitor C1.

Since the gate of the transistor T5 is thus connected through the resistor R2, said transistor is OFF in a normal state, but when a high voltage is applied to the input terminal IN, the voltage is divided by capacitors C1 and C2, where C2 is the parasitic capacitance between the gate of said transistor and ground and is shown by dotted line, and so forth then applied to the gate of said transistor to turn it ON. The magnitude of excessive input voltage that turns the transistor T5 ON is determined by the ratio of voltage division of C1, C2 and the threshold voltage of said transistor. Therefore, these elements are accordingly selected. When the transistor T5 is turned ON, the voltage to be applied to the gate of transistor T2 of the internal circuit A is led to ground via the resistor R1 and the transistor T5. As a result, the gate of the transistor T2 is protected, and since the voltage drop through the gate insulating layer 10 (FIG. 4B) of the transistor T5 is small, the transistor T5 is also safe from being ruptured.

The specific structure of the device of the invention is shown in FIGS. 4B and 4C. As will be understood from FIG. 4B, the cross-sectional structure of the transistor T5 is similar to that of FIG. 2, except that the insulating layer 16 of phosphosilicate glass (PSG) is grown on a silicon gate electrode 12, with an aluminum electrode 18 formed on a PSG layer 16. The PSG layer 16 is the one generally used in the art as an insulation layer beneath aluminum wiring in the manufacturing process of integrated circuits, but is used in the invention as a dielectric. Part of the aluminum wiring is used as the electrode 18, with the capacitor C1 provided between said electrode and the gate electrode 12. The heavily doped region 6 such as, for example, the source region of the transistor T5, is grounded by aluminum wiring 20, and the other heavily doped region 8 such as, for example, the drain region, is connected to the input terminal IN by aluminum wiring 22 via the resistor R1 and to the gate of the transistor T2 of the internal circuit by aluminum wiring 24. The gate of the transistor T5 is grounded through the resistor R2, but this is not shown in FIG. 4B.

FIG. 4C illustrates the aforedescribed structure in plan view, in which the resistor R1 is a diffused resistor connected to the drain region 8. Points P1 and P2 of the resistor R1 are in contact with the wiring 22 and 24, respectively. The resistor R2 is formed by polycrystalline silicon extending from one end of the polycrystalline silicon gate 12. The other end of the resistor R2 is in contact with wiring 20 at a point P3. In addition, the aluminum electrode 18 has one end above gate electrode 12. In FIG. 4C, the source region 6 and the wiring 20 are in contact, and at a point P4 the gate oxide layer 10 and PSG layer 16 are not shown in FIG. 4C.

It is to be understood here that, although sapphire 2 is used to fabricate thereon what is shown in FIG. 4A, other insulating material such as spinel, a bulk silicon, or semi-insulating material, such as chromium doped GaAs, may be used just as well, instead of sapphire as a substrate. The protective circuit which is fabricated using other insulating material, a bulk silicon, or semi-insulating material functions as effectively as the one fabricated on the sapphire 2. It should be noted that, although silicon gate MOS transistors are used in FIG. 4A as the transistors T2 and T5, other self-aligned MOS transistors such as molybdenum ($M_0$) gate MOS transistors, molybdenum-silicide ($M_0Si_2$) gate MOS transistors or tungsten (W) gate MOS transistors may be used.

With regard to FIG. 4B, it may be considered that, by eliminating the gate electrode 12, a transistor with a thick gate insulating layer 16 may be formed similar to the protective one having a high value threshold voltage, as shown in FIG. 1, which utilizes a field oxide layer. It has been found, however, that the threshold voltage of such a transistor is very unstable because of the charges in the PSG layer 16. It is to be noted further that diffusion of the source and drain regions is realized in a self-alignment fashion using the gate electrode as a mask in a usual silicon gate process, so that should the electrode 12 be eliminated, there cannot be diffusion of the source and drain. This is not in line with the established processes for the manufacture of silicon gate MOS IC.

The protective transistor of the stacked gate type shown in FIG. 4B has such elements as the silicon island 4, the source region 6 and the drain region 8, the gate insulating layer 10 and the silicon gate electrode 12, all of which are fabricated in the same process similar to the transistor of the internal circuit. The PSG layer 16 is grown for the known purpose of wiring insulation and the electrode 18 is part of such wiring. Thus, fabrication of the device of FIG. 4B is realized without any disturbance to the established processes for the manufacture of a silicon gate MOS IC.

In the embodiment of FIG. 4B, the thickness of PSG layer 16 is about 8000 Å, and that of the gate insulating oxide (silicon dioxide) layer 10 is about 500 Å. The resistances of the resistors R1 and R2 are in a range of 1 kΩ and 1 MΩ, respectively. The resistance of the resistor R1 is so determined that it is high enough to protect the gate of the transistor T2, but not too high as to cause delay in the transmission of signals. In this embodiment, the polycrystalline silicon layer has a desired pattern and is formed on the silicon island 4 and the insulating layer 14 to form the gate electrode of the transistor T5 and the resistor R2. Then, an impurity is introduced with low dosage into the polycrystalline silicon layer for adjusting the resistivity of the resistor R2.

The polycrystalline silicon layer portion of the resistor R2 is thereafter covered by a photoresist. Then, the same conductivity type impurity is introduced with high dosage into the polycrystalline silicon layer of the gate electrode of the transistor T5, the contact portion P3 and the source and drain regions. Thereby, the polycrystalline silicon layer portion of the resistor R2 has a high resistance and the polycrystalline silicon layer of the gate electrode of the transistor T5, the contact portion P3 and the source and drain regions, has a low resistance. The heavily doped regions 6 and 8 are formed by a second ion implantation. The resistor R1 may also be formed by the second ion implantation.

Figure 5A:
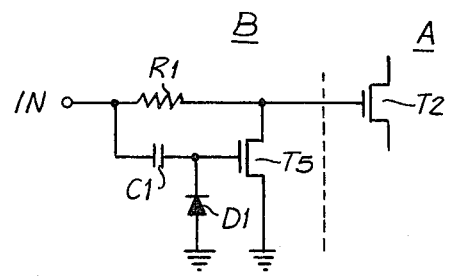
FIGS. 5A and 5B are an equivalent circuit diagram and a cross-sectional view, respectively, of an essential part of another embodiment of the semiconductor integrated circuit device of the invention.
Figure 5B:
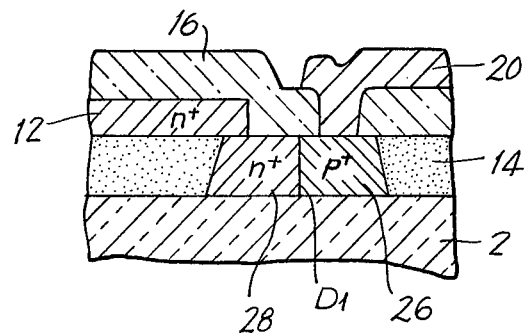

FIG. 5A is an equivalent circuit diagram and FIG. 5B is a cross-sectional view of an essential part of another embodiment of the invention. In the embodiment of FIGS. 5A and 5B, the resistor R2 of FIG. 4A is replaced by a diode D1. As shown in FIG. 5B, a P+-type region 26 is grounded via the wiring 20 (FIG. 4C), and an n+-type region 28 is connected to an end portion of the N+-type polycrystalline silicon layer 12 which comprises the gate electrode. The diode D1 leaks considerably, so that the gate of the transistor T5 is maintained at ground potential in a stationary state, and said transistor remains OFF. The operation is similar to that of the embodiment of FIGS. 4A to 4C.

As hereinbefore described, source and drain regions are formed in a self-alignment fashion using polycrystalline silicon as a mask, in accordance with the invention. That is, the layer of polycrystalline silicon is patterned, then implantation of ions of impurities is carried out. If the polycrystalline silicon layer floats, charges may be stored in the floating region, and the operation of the transistor is rendered unstable. This is why the polycrystalline silicon layer is grounded via the resistor R2 having a high resistance. If a high voltage such as, for example, a voltage resulting from an electrostatic discharge, happens to be applied to the input terminal, the transistor T5 turns ON and protection is instituted. Thus, a transistor having an equivalent thick oxide layer may be manufactured, in accordance with the invention, without any additional processes or masks.

Furthermore, in accordance with the invention, a circuit which protects the internal circuit of the silicon gate MOS IC is fabricated simultaneously with the fabrication of the internal circuit and without changing any process for such fabrication.

While the invention has been described by means of specific examples and in specific embodiments, I do not wish to be limited thereto, for obvious modifications will occur to those skilled in the art without departing from the spirit and scope of the invention.

I claim:

1. A semiconductor integrated circuit device for protecting an element having an input gate electrode, said device comprising
    a first resistor interposed between an input terminal and the input gate electrode of the element to be protected;
    an MIS type transistor having an input gate electrode drain and source regions, one of said drain and source regions being connected to said input gate electrode of said element and the other of said drain and source regions being connected to ground;
    a capacitor interposed between said input gate electrode of said MIS type transistor and said input terminal; and
    one of a second resistor and a diode being interposed between and connected to said input gate electrode of said MIS type transistor and ground.

2. A semiconductor integrated circuit device as claimed in claim 1, wherein said MIS type transistor is an N-channel type silicon gate MOS transistor.

3. A semiconductor integrated circuit device, wherein an internal circuit and a protective circuit which protects the input gate of an insulated gate type transistor of said internal circuit against a high voltage are fabricated by elements of silicon-on-sapphire (SOS) structure, said semiconductor integrated circuit device comprising a transistor in said protective circuit consisting of an insulated gate type transistor fabricated in the same manner as said internal circuit;

a resistor;

a diode of reverse polarity;

the input gate of said transistor in said protective circuit being grounded through one of said resistor and diode;

a metal electrode provided on said input gate through an insulation layer;

another resistor; and input means for applying an input signal to said metal electrode, one of the source and drain regions of said transistor in said protective circuit being grounded and said input signal being applied to the other of said source and drain regions and to said gate of said transistor of said internal circuit through said another resistor.

4. A semiconductor integrated circuit device for protecting an element having an input gate electrode, said device comprising a first resistor interposed between an input terminal and the input gate electrode of the element to be protected;

an MIS type transistor having drain and source regions, one of said drain and source regions being connected to said input gate electrode of said element and the other of said drain and source regions being connected to ground, said MIS type transistor being a stacked gate type transistor having a silicon island, source and drain regions, a gate insulating layer of silicon dioxide, a silicon input gate electrode, a layer of phosphosilicate glass and an aluminum electrode;

a capacitor interposed between said silicon input gate electrode of said MIS type transistor and said input terminal; and one of a second resistor and a diode being interposed between and connected to said silicon input gate electrode of said MIS type transistor and ground.

5. A semiconductor integrated circuit device for protecting an element having an input gate electrode, said device comprising a first resistor interposed between an input terminal and the input gate electrode of the element to be protected, said first resistor having a low resistance value in the order of one kilohm;

an MIS type transistor having an input gate electrode and drain and source regions, one of said drain and source regions being connected to said input gate electrode of said element and the other of said drain and source regions being connected to ground;

a capacitor interposed between said input gate electrode of said MIS type transistor and said input terminal; and one of a second resistor and a diode being interposed between and connected to said input gate electrode of said MIS type transistor and ground, said second resistor having a high resistance value in the order of one megohm.

* * * * *